(12) United States Patent
Lovett et al.

(10) Patent No.: US 6,879,538 B2
(45) Date of Patent: Apr. 12, 2005

(54) ZERO POWER CHIP STANDBY MODE

(75) Inventors: Simon J. Lovett, Boise, ID (US);
Thomas J. Pawlowski, Boise, ID (US);
Brian P. Higgins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/228,932

(22) Filed: Aug. 28, 2002

(65) Prior Publication Data

US 2003/0043678 A1 Mar. 6, 2003

Related U.S. Application Data

(62) Division of application No. 09/942,898, filed on Aug. 30, 2001.

(51) Int. Cl.[7] .................................................. G11C 7/00
(52) U.S. Cl. ......................................... 365/226; 365/63
(58) Field of Search ........................... 365/226, 63, 229

(56) References Cited

U.S. PATENT DOCUMENTS

| | | | | |
|---|---|---|---|---|
| 4,747,600 A | * | 5/1988 | Richardson | 463/19 |
| 4,853,563 A | * | 8/1989 | Hill et al. | 326/83 |
| 4,906,862 A | | 3/1990 | Itano et al. | 365/185.17 |
| 4,963,769 A | | 10/1990 | Hiltpold et al. | 365/185.18 |
| 5,117,129 A | * | 5/1992 | Hoffman et al. | 326/13 |
| 5,182,810 A | * | 1/1993 | Bartling et al. | 713/323 |
| 5,192,883 A | * | 3/1993 | Kimura | 365/189.05 |
| 5,301,160 A | * | 4/1994 | McAdams | 365/226 |
| 5,338,978 A | * | 8/1994 | Larsen et al. | 307/443 |
| 5,359,243 A | | 10/1994 | Norman | 307/475 |
| 5,495,182 A | | 2/1996 | Hardy | 326/50 |
| 5,517,186 A | | 5/1996 | Veenstra | 340/825.83 |
| 5,532,623 A | | 7/1996 | Advani et al. | 327/51 |
| 5,570,050 A | | 10/1996 | Conary | 327/143 |
| 5,721,704 A | * | 2/1998 | Morton | 365/185.23 |
| 5,794,137 A | * | 8/1998 | Harte | 455/343 |
| 5,956,502 A | * | 9/1999 | Manning | 713/503 |
| 6,163,206 A | * | 12/2000 | Kobayashi | 327/540 |
| 6,353,599 B1 | * | 3/2002 | Bi et al. | 370/328 |
| 6,396,137 B1 | * | 5/2002 | Klughart | 257/691 |
| 6,438,043 B2 | | 8/2002 | Gans et al. | 365/194 |
| 6,507,523 B2 | * | 1/2003 | Pekny | 365/189.09 |
| 6,618,825 B1 | * | 9/2003 | Shaw | 714/55 |

* cited by examiner

*Primary Examiner*—David Nelms
*Assistant Examiner*—Ly Duy Pham
(74) *Attorney, Agent, or Firm*—Fletcher Yoder

(57) ABSTRACT

A zero power standby mode in a memory device used in a system, such as a battery powered hand held device. By disconnecting the internal power supply bus on the memory device from the external power supply during standby mode, the junction leakage and gate induced drain leakage can be eliminated to achieve a true zero-power standby mode. A p-channel field effect transistor (FET) may be used to gate the external power supply such that the internal power supply bus on the memory device may be disconnected from the external power supply.

18 Claims, 3 Drawing Sheets

ZERO POWER CHIP STANDBY MODE

This application is a DIV of Ser. No. 09/942,898 filed Aug. 30, 2001

BACKGROUND OF THE INVENTION

1. Field of the Invention

The present invention relates generally to memory devices. More particularly, the present invention relates to a zero power standby mode in a memory device, and even more particularly, to a zero power standby mode in a system, such as a wireless battery powered handheld device.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Wireless, battery-powered handheld devices, such as cellular phones, handheld computers, and personal digital assistants (PDAs) are becoming increasingly useful in today's computer industry. Cellular phones are becoming increasingly tantamount to competent business practices, in addition to being highly demanded for personal use. Conventional PDA units and handheld computers typically provide a user with a handheld device which serves as an abbreviated version of a larger laptop or desktop computer system. They provide a user with an operating system and various software programs to accommodate scheduling, word processing, and a variety of other functions. Advantageously, these units comprise small, light-weight systems which provide a significant amount of computing power. However, it is clear that with the advantages of decreasing the size of a computing system, certain functional tradeoffs typically must be made.

With the proliferation of wireless, battery-powered handheld devices, one of the biggest challenges for designers is to provide a wireless power supply which is small enough to be incorporated into these small and mobile devices, while providing a sufficient amount of power to provide adequate functionality of the device for as long as possible. Techniques for reducing power consumption without reducing device functionality, such as by providing low standby power while the device is not being used, are becoming increasingly important to extended battery usage. For handheld devices incorporating memory chips such as Static or Dynamic Random Access Devices or FLASH (SRAMs or DRAMs or FLASH), "zero-power" standby modes are often implemented. Zero-power standby modes generally refer to sleep states in which a system or device draws a minimal amount of current and thereby consumes a minimal amount of power. Though typical zero-power standby modes consume relatively less power than normal modes of operation, the standby mode may not truly be a zero-power standby mode, despite the use of the term "zero-power." Standby modes typically result in a leakage current of 10–20 $\mu$A. The leakage current is typically produced from the complimentary metal-oxide-semiconductor (CMOS) technology which is typically used to manufacture SRAM and DRAM devices. CMOS junction leakage, sub-threshold leakage, and gate induced drain leakage (GIDL) in the memory core device. Other CMOS-based devices such as universal serial bus (JSB) controllers, digital signal processors (DSP), and base-band processors may also exhibit these leakage mechanisms. While this amount of leakage current is tolerable in many applications, it would be advantageous to reduce the leakage current to provide a true zero-power standby mode and thus, increase the battery life of the handheld devices.

The present invention may address one or more of the problems set forth above.

BRIEF DESCRIPTION OF THE DRAWINGS

The foregoing and other advantages of the invention will become apparent upon reading the following detailed description and upon reference to the drawings in which:

FIG. 3 is a schematic illustration of the elements described in FIG. 2; and

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
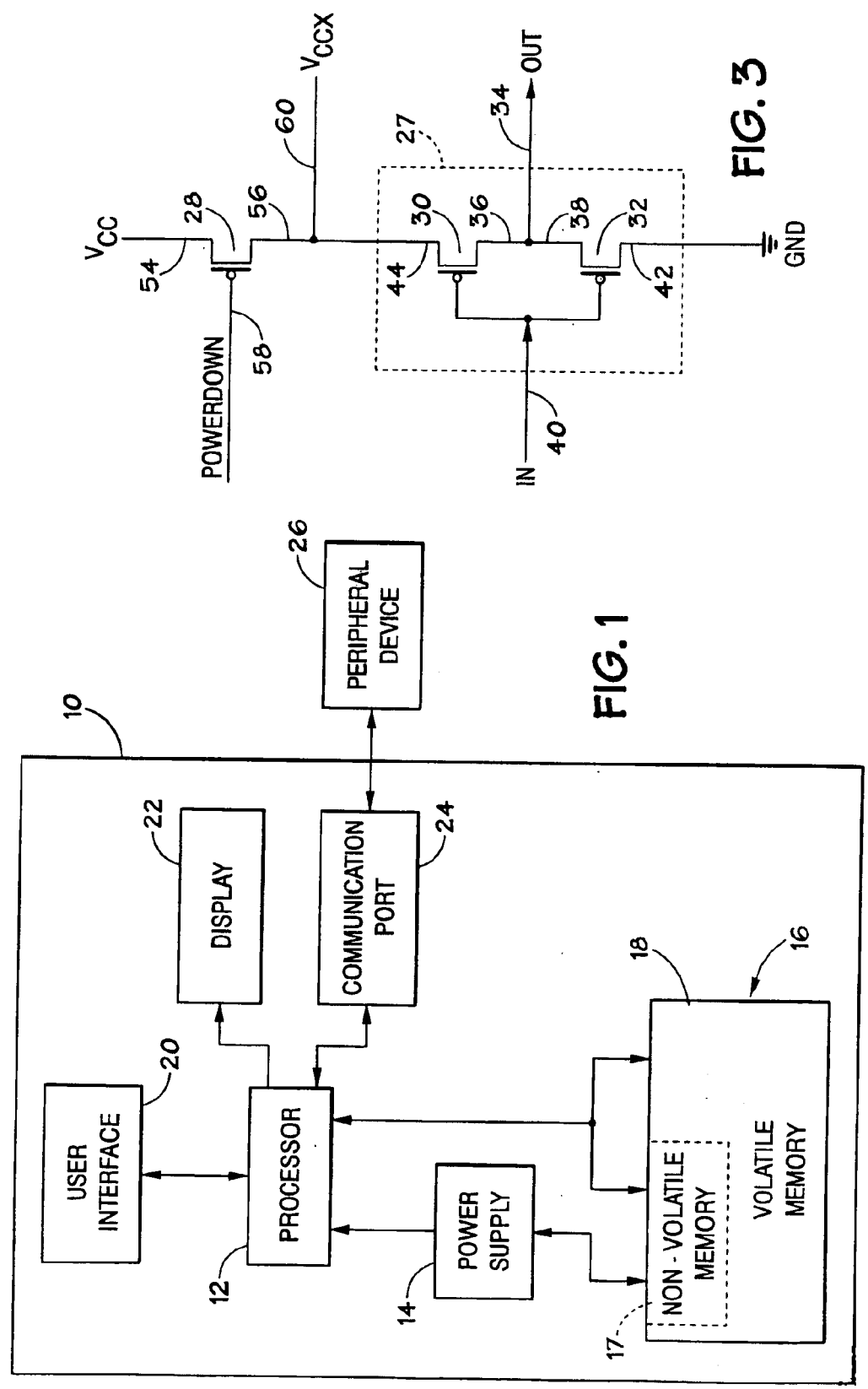
FIG. 1 illustrates a block diagram of an exemplary wireless, battery-powered device.

Turning now to the figures and initially referring to FIG. 1, a block diagram of an exemplary wireless, battery-powered handheld device is illustrated. The handheld device 10 may be a cellular phone, handheld computer, personal digital assistant (PDA) or any other wireless, battery-powered device. The handheld device 10 includes a processor 12, such as a microprocessor and a power supply 14, such as a rechargeable battery or a replaceable battery which may be located internally or externally with respect to the handheld device 10. The processor 12 and the power supply 14 are also coupled to a memory 16. The memory 16 may include non-volatile memory 17, such as read only memory (ROM) or flash memory, to store application and system software. Further, the memory 16 includes a section of volatile memory 18, which may include static random access memory (SRAM) devices and/or dynamic random access memory devices. The size of the non-volatile memory 17 is typically selected to be just large enough to store any necessary operating system, applications programs, and fixed data. The volatile memory 18, on the other hand, may be larger to facilitate the dynamic storage of certain applications and information entered by a user. The volatile memory 18 generally comprises millions of logical elements which are produced using CMOS technology, for example.

Various other devices may be coupled to the processor 12, depending on the specific handheld device 10. For instance, a user interface 20 may be coupled to the processor 12. The user interface 20 may include an input device, such as buttons, switches, a keyboard, a light pin, a mouse, and/or a voice activated interface, for instance. A display 22 may also be coupled to the processor 12. The display 22 may include an LCD display, LEDs, and/or an audio display. A communication port 24 may be adapted to be coupled to a peripheral device 26, such as a modem, a printer, a docking station, a desktop computer, or a network device, for instance.

Figure 2:
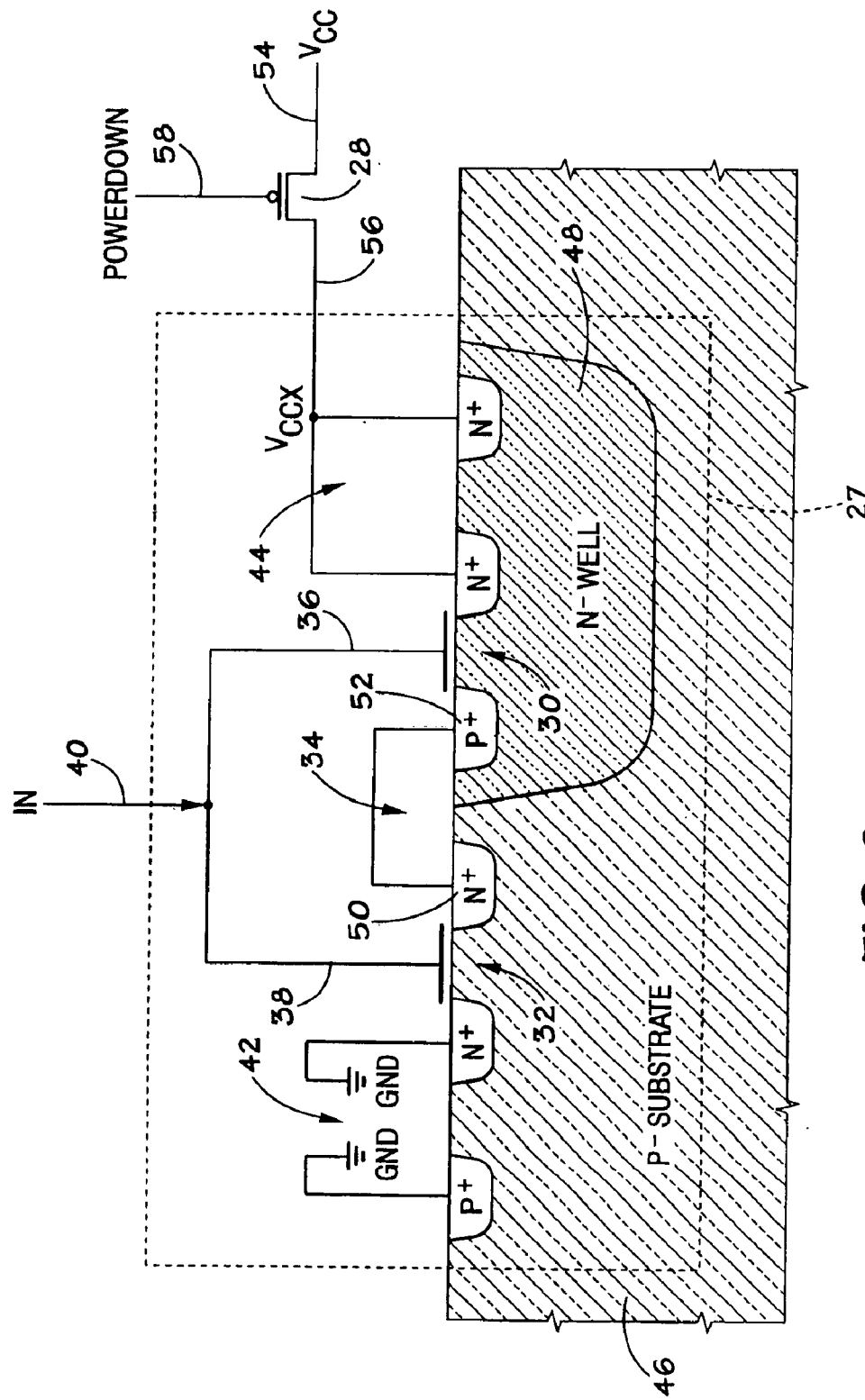
FIG. 2 illustrates a cross section of an exemplary CMOS inverter and the leakage currents associated therewith, and an isolation circuit in accordance with the present techniques.

Turning now to FIG. 2, an exemplary CMOS inverter, generally illustrated by reference numeral 27, and an isolation circuit, here a p-channel FET 28, are illustrated. The isolation circuit, here the p-channel FET 28, may be used to disconnect the CMOS inverter 27 on the SRAM/DRAM chip from the power signal Vcc delivered by the external (with respect to the SRAM/DRAM chip) power supply 14. By gating the chip and disconnecting the power path to the chip during standby mode, the leakage currents discussed above can be reduced to zero. The CMOS inverter 27 is shown by way of example to illustrate the leakage mechanisms associated with CMOS technology. The same leakage mechanisms are generally applicable to other CMOS elements, such as NAND and NOR gates, for example, which may be incorporated in the volatile memory 18. While a CMOS inverter 27 is illustrated, the present techniques, can be used to eliminate the leakage mechanisms in various CMOS elements, such as NAND and NOR gates, for instance.

As generally understood by those skilled in the art, the basic CMOS inverter 27 includes two complimentary transistors: a p-channel FET 30 and an n-channel FET 32. The drains of the FETs 30 and 32 are tied together to form a single output node 34. The gates 36 and 38 of the FETs 30 and 32 are also tied together to provide a single input node 40 to both of the FETs 30 and 32, which is configured to receive an input signal IN. The source 42 of the n-channel FET 32 is tied to a ground signal GND. Typically, the source 44 of the p-channel FET 30 receives a voltage signal Vcc from the power supply 14 (FIG. 1). However, as will be explained further below, the p-channel FET 28 has been placed in the power path to provide an isolation mechanism to eliminate the leakage current. Thus, the source 44 of the p-channel FET 30 receives a gated voltage signal which may be referred to as internal voltage signal Vccx.

Before discussing the isolation technique, the present leakage mechanisms are briefly described. At the wafer level, a p-type substrate 46 with an n-type well region 48 includes p-doped (p+) and n-doped (n+) regions to facilitate the current flow over the channel of each FET 30 and 32. In typical SRAM and DRAM devices incorporating a low-power standby mode, leakage current, gate induced drain leakage (GIDL) and sub-threshold leakage often result in a power loss resulting from a leakage current of at least 10–20 $\mu A$ while the device is in standby mode, as previously discussed.

Depending on whether an input voltage IN is applied at the input node 40, the output node 34 (common drain) is either logically high or logically low. If there is a logic high voltage Vcc supplied at the input 40, the output 34 will be at a logical low. If there is a logic low voltage GND supplied at the input 40, the output 34 will be at a logical high. If a logical high exists on the output node 34, current leakage occurs from the n+ region 50 to the p-substrate 46 at the junction point of the regions by means of reverse biased junction leakage. Similarly, if a logical low exists on the output node 34, current leakage occurs from the p+ region 52 to the n-well region 48 at the junction point of the regions again by reverse biased junction leakage. Further, junction leakage occurs from the n-well region 48 to the p-type substrate 46 whenever the n-well region 48 is powered-up by the Vcc signal.

To eliminate the junction leakage with an isolation circuit, a p-channel FET 28 may be added in the power path of the voltage signal Vcc. Instead of coupling the source 44 of the CMOS element, here the inverter 27, the source 54 of the p-channel FET 28 is coupled voltage source Vcc. The drain 56 is coupled to the source 44 of the p-channel FET 30 and to an internal power supply bus (illustrated in FIGS. 3 and 4), which carries an internal voltage signal Vccx to various elements within the SRAM/DRAM chip. As discussed further below, any elements coupled to the internal power supply bus can be disconnected from the external voltage source Vcc using the isolation circuit, here the p-channel FET 28. The gate 58 of the p-channel FET 28 is configured to receive the control signal POWERDOWN, which provides the control for the isolation circuit, as is further illustrated with reference to FIG. 3.

FIG. 3 is a schematic illustration of the inverter 27 and the p-channel FET 28 illustrated in FIG. 2. For clarity, like reference numerals are used to describe elements identical to or similar to those previously discussed. Thus, the isolation circuit, here the p-channel FET 28 receives the external power signal Vcc at its source 54. The drain 56 is coupled to an internal power bus 60 and is configured to provide an internal voltage signal Vccx. Any elements tied to the internal power bus 60, such as the CMOS inverter 28 illustrated by way of example, can be isolated from the external power signal Vcc. The gate 58 of the p-channel FET 28 receives the control signal POWERDOWN. By enabling the control signal POWERDOWN, all internal elements which receive the internal voltage signal Vccx will be isolated completely from the external voltage signal Vcc. Thus, the p-channel FET 28 acts like a master switch to disconnect the external power signal Vcc from the internal power bus 60 inside the DRAM/SRAM or other semiconductor device, as is further illustrated in FIG. 4. When the power signal Vcc is disconnected, the drain current and junction leakage paths are eliminated to allow the DRAM/SRAM chip to enter into an ultra low power standby mode. Advantageously, by physically disconnecting the external power signal Vcc from the device, the GIDL and subthreshold leakage mechanisms are also eliminated. As should be evident to those skilled in the art, other equivalent circuits such as an n-channel with a pumped gate may be used to isolate the external power supply from the internal power supply bus.

Figure 4:
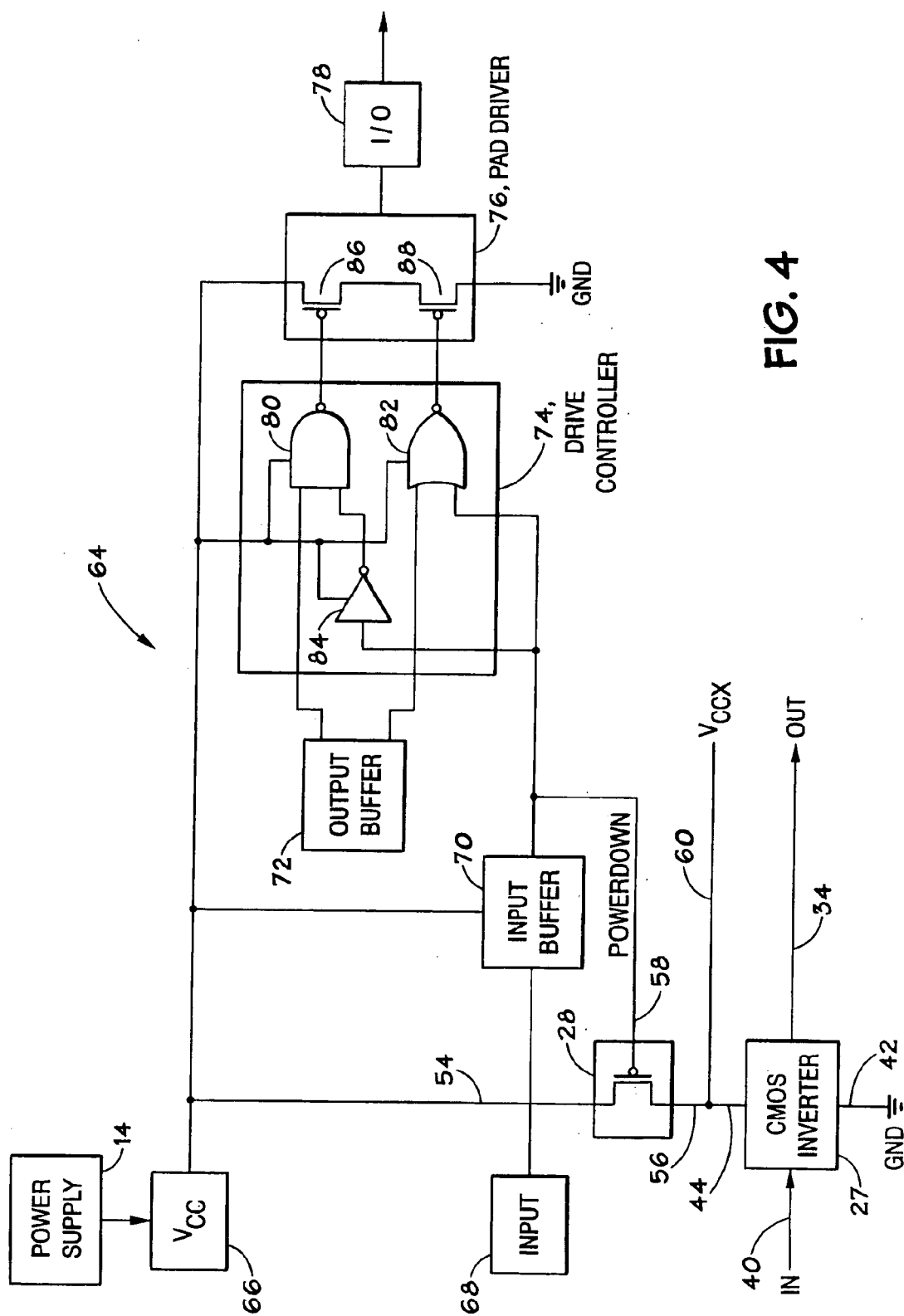
FIG. 4 illustrates a block diagram of a memory device incorporating the isolation circuit illustrated in FIG. 3 in accordance with the present techniques.

FIG. 4 illustrates a simplified block diagram of a portion of an SRAM/DRAM chip 64 that implements a power-down scheme in accordance with the techniques described with reference to FIGS. 2 and 3. The SRAM/DRAM chip 64 is generally part of the volatile memory 18, as previously discussed with reference to FIG. 1. While an SRAM/DRAM chip 64 is illustrated, the same techniques may be applied to a FLASH memory chip or other devices with similar leakage mechanisms such as DSP or USB chips, for example. The SRAM/DRAM chip 64 includes a pad 66 configured to receive a power signal Vcc from a power supply 14. As previously described, the power supply 14 may be a battery within the handheld device 10. The power supply 14 is located externally with respect to the SRAM/DRAM chip 64 and delivers the power signal Vcc to the pad 66 and to the isolation circuit, here p-channel FET 28, located internally with respect to the SRAM/DRAM chip 64. Specifically, the power source Vcc is delivered to the source 54 of the p-channel FET 28. The drain 54 of the p-channel FET 56 is tied to the internal power bus 60, thereby delivering the external voltage signal Vcc to the internal power bus 60 while the SRAM/DRAM chip 64 is in a normal mode of operation and the control signal POWERDOWN is disabled. Internal components in the SRAM/DRAM chip 64, such as the CMOS inverter 27, receive the internal voltage signal Vccx from the internal power bus 60. When the control signal POWERDOWN is enabled, thereby indicating that the SRAM/DRAM chip 64 is in power-down or standby mode, all internal elements in the SRAM/DRAM chip 64 are powered down since the power signal Vcc from the power supply 14 is completely cut-off from the internal power bus 60. Thus, the leakage current from the CMOS memory device (here the SRAM/DRAM chip 64) is eliminated, and a true zero-power standby mode can be achieved.

A pad 68 may be used to provide an input buffer 70 with the input signal INPUT from the pad 68. The input buffer 70 is connected to the input gate 64 of the p-channel FET 60 to provide the control signal POWERDOWN to isolate the internal supply bus 60 from the external power source Vcc when the SRAM/DRAM 64 transitions to standby mode. At the satisfaction of some predetermined condition which triggers initiation of the standby mode, such as the expiration of a timeout circuit, the input buffer 70 sends a control signal POWERDOWN to the p-channel FET 28 to isolate the internal supply bus 60 from the external power supply Vcc. Similarly, once another condition is satisfied which triggers a return to a normal mode of operation, such as the pressing of a key on the handheld device, the input buffer 70 disables the control signal POWERDOWN, thereby restoring external power Vcc to the internal supply bus 60. The input buffer 70 may continue to receive the power signal Vcc during standby mode.

Further, in one embodiment of the present technique, other control blocks, such as an output buffer 72, drive controller 74, and pad driver 76, may remain powered up while the rest of the chip 64 is in standby mode. It may, for instance, be advantageous to deliver the power signal Vcc to certain internal elements which are slow to restart and which may cause undesirable delays in transitioning out of standby mode. Further, it may be advantageous to select certain internal elements to remain functional during standby mode to prevent inadvertent interaction with external devices while the SRAM/DRAM chip 64 is in standby mode. Here, the power signal Vcc is delivered to the output buffer 72, the drive controller 74, and the pad driver 76 to keep the I/O pad 78 in a tri-state condition during transitions between modes. By "tri-stating" the I/O pad 78 which serves as a bus driver providing the SRAM/DRAM chip 64 access to the rest of the system, such as a handheld device 10, the power down state of the SRAM/DRAM chip 64 will not adversely effect other elements in the system.

The output buffer 72 prevents the rest of the system from being affected by transitions between normal and standby modes of operation. The output buffer 72 may include a number of latches and storage elements to store data temporarily until it is appropriate to latch the data out of the output buffer 72. The output buffer 72 may also provide inputs to the drive controller 74.

The drive controller 74 is used to drive the output pad (or pads) 78 high, low, or into a tri-state condition. In and exemplary embodiment, the drive controller 74 may include a NAND gate 80, a NOR gate 82, and an inverter 84. The NAND gate 80 and the NOR gate 82 each receive a signal from the output buffer 72, as well as the power signal Vcc which is supplied through the pad 66. The second input of the NOR gate 82 is coupled to the input buffer 70 to provide the power down control signal indicating whether the internal power bus is powered down. The second input of the NAND gate 80 receives the inverted power down control signal from the input buffer 72 through the inverter 84. Further, the drive controller 74 may include delay latches to insure proper signal timing.

The pad driver 76 is coupled to the outputs of the drive controller 74. Specifically, the outputs of the NAND gate 80 and the NOR gate 82 may be coupled to the gates of FETs 86 and 88 in the pad driver 76. The output of the NAND gate 80 is delivered to the gate of the p-channel FET 86. The source of the p-channel FET 86 receives the power signal Vcc, even when the SRAM/DRAM chip 64 is in standby mode. The output of the NOR gate 82 is delivered to the gate of the n-channel FET 88. The source of the n-channel FET 88 is tied to a ground source GND. The drain of each FET 86 and 88 is tied together and provides a single input for the I/O pad 78.

By providing a power signal Vcc to the p-channel FET 28 and controlling the application of the power signal Vcc to the internal power bus 60 using the input buffer 70, a true zero-power standby mode can be achieved. Further, the power signal Vcc may be coupled to selected components on the SRAM/DRAM chip 64, such as the drive controller 74 and pad driver 76 to provide a minimal amount of power to these components during standby mode, or to insure that other components of the handheld device 10 are not affected by the transitions between modes of operation.

It should be understood that while the present techniques were described with reference to battery-powered handheld devices, it should be evident to those skilled in the art that the techniques described herein are applicable to any system in which power budgeting is preferred. Further, while the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of manufacturing a memory device for implementing a standby mode in a system comprising the acts of:

providing a memory device having an internal power bus and a plurality of components configured to receive a power signal, wherein the power bus is internal with respect to the memory device and the plurality of components internal with respect to the memory device comprise an input buffer and circuitry;

providing an electrical path configured to deliver an external power signal to the internal power bus;

providing an output buffer coupled to the electrical path and configured to receive the external power signal, wherein the output buffer is not coupled directly to the internal power bus; and providing an isolation transistor on the electrical path, the isolation transistor configured to disconnect the external power signal from the internal power bus in response to initiating a standby mode in the system, wherein the plurality of components receive the power signal while in the standby mode.

2. The method of manufacturing a memory device for implementing a standby mode in a system, as set forth in claim 1, wherein the act of providing an isolation transistor comprises the act of providing a p-channel field effect transistor (FET).

3. The method of manufacturing a memory device for implementing a standby mode in a system, as set forth in claim 1, wherein the act of providing an isolation transistor comprises the act of providing an isolation transistor which is configured to disconnect the external power signal from the internal power bus in response to the occurrence of an event.

4. The method of manufacturing a memory device for implementing a standby mode in a system, as set forth in claim 3, comprising the act of providing an isolation transistor which is configured to disconnect the external power signal from the internal power bus in response to the occurrence of an event, and wherein the event comprises the expiration of a counter.

5. The method of manufacturing a memory device for implementing a standby mode in a system, as set forth in claim 4, wherein the act of providing an isolation transistor which is configured to disconnect the power signal from the internal power bus in response the occurrence of an event, and wherein the event comprises receiving a control signal at an input of the isolation transistor, and wherein the control signal is delivered in response to a transitioning of the system from a normal mode of operation to a standby mode of operation.

6. The method of manufacturing a memory device for implementing a standby mode in a system, as set forth in claim 1, comprising providing an isolation transistor configured to disconnect the power signal from the internal power bus in response to the occurrence of an event without disconnecting the external power signal from the output buffer.

7. The method of manufacturing a memory device for implementing a standby mode in a system, as set forth in claim 1, wherein the circuitry is configured to drive an input/output pad into a tri-state condition.

8. A method of manufacturing a system for implementing a standby mode comprising the acts of:
   providing a processor;
   providing a power supply coupled to the processor and adapted to deliver a power signal to the processor;
   providing a memory device coupled to the processor and the power supply, the memory device having an internal power bus and a plurality of components that are internal to the memory device and configured to receive the power signal, wherein the plurality of components comprise an input buffer and circuitry;
   providing an output buffer configured to receive the power signal, wherein the output buffer is not coupled directly to the internal power bus;
   configuring an electrical path to deliver the power signal from the power supply to the internal power bus; and
   providing an isolation transistor on the electrical path, the isolation transistor configured to disconnect the power supply from the internal power bus if a standby mode is activated, wherein the plurality of components receive the power signal when the standby mode is activated.

9. The method of manufacturing a system for implementing a standby mode, as set forth in claim 8, comprising the act of providing a display that is coupled to the processor.

10. The method of manufacturing a system for implementing a standby mode, as set forth in claim 8, comprising the act of providing a communication port that is coupled to the processor and adapted to communicate with at least one of a plurality of peripheral devices.

11. The method of manufacturing a system for implementing a standby mode, as set forth in claim 8, wherein the act of providing an isolation transistor comprises the act of providing an isolation transistor that is configured to disconnect the power supply from the internal power bus in response to the occurrence of an event.

12. The method of manufacturing a system for implementing a standby mode, as set forth in claim 8, wherein the act of providing an isolation transistor comprises the art of providing an isolation transistor that is configured to disconnect the power supply from the internal power bus in response the occurrence of an event, and wherein the event comprises receiving a control signal at an input of the isolation transistor, and wherein the control signal is delivered in response to a transitioning of the system from a normal mode of operation to a standby mode of operation.

13. The method of manufacturing a system for implementing a standby mode, as set forth in claim 8, comprising providing an isolation transistor configured to disconnect the power signal from the internal power bus in response to the occurrence of an event without disconnecting the power supply from an input/output pad.

14. The method of manufacturing a system for implementing a standby mode, as set forth in claim 8, wherein the circuitry is configured to drive an input/output pad into a tri-state condition.

15. A method of manufacturing a memory device for implementing a standby mode in a system comprising the acts of:
   providing a memory device having an internal power bus configured to receive a power signal from a source external to the memory device and to provide the power signal to a plurality of memory components in the memory device;
   providing a input buffer and circuitry in the memory device that are coupled to the internal power bus and an electrical path, wherein the input buffer and circuitry are configured to receive the power signal;
   providing an output buffer coupled to the electrical path and configured to receive the power signal; and
   providing an isolation transistor on the electrical path, the isolation transistor configured to disconnect the power signal from the internal power bus in response to the initiation of a standby mode, wherein the input buffer and circuitry receive the power signal in the standby mode.

16. The method of manufacturing a memory device for implementing a standby mode in a system, as set forth in claim 15, wherein the isolation transistor comprises a p-channel field effect transistor (FET).

17. The method of manufacturing a memory device for implementing a standby mode in a system, as set forth in claim 15, wherein the memory device comprises a Static Random Access Memory device.

18. The method of manufacturing a memory device for implementing a standby mode in a system, as set forth in claim 15, wherein the memory device comprises a Dynamic Random Access Memory device.

* * * * *